United States Patent [19]

Ehrfeld et al.

[11] Patent Number: 5,376,506
[45] Date of Patent: Dec. 27, 1994

[54] METHOD TO PRODUCE NONLINEAR OPTICAL MICROCOMPONENTS

[75] Inventors: Wolfgang Ehrfeld, Mainz; Herbert O. Moser, Karlsruhe; Klaus Mullen, Mainz; Christoph Bubeck, Eltville; Hans-Dieter Bauer, Partenheim, all of Germany

[73] Assignee: IMM, Institut fur Mikrotechnik GmbH, Mainz, Germany

[21] Appl. No.: 1,194

[22] Filed: Jan. 7, 1993

[30] Foreign Application Priority Data

Jan. 10, 1992 [DE] Germany ............... 4200397

[51] Int. Cl.⁵ .................................. G02B 6/10
[52] U.S. Cl. ................... 430/321; 264/1.24; 264/25; 385/122; 430/967
[58] Field of Search ............ 430/321, 967, 326; 385/5, 16, 122, 130, 132, 143, 145; 264/1.4, 1.5, 2.5

[56] References Cited

U.S. PATENT DOCUMENTS

| | | | |
|---|---|---|---|
| 4,351,653 | 9/1982 | Becker et al. | 55/394 |
| 4,775,215 | 10/1988 | Teng et al. | 385/143 |
| 4,784,935 | 11/1988 | Ehrfeld et al. | 430/321 |
| 4,805,975 | 2/1989 | Utaka et al. | 385/122 |
| 5,113,471 | 5/1992 | Inaishi et al. | 385/126 |
| 5,210,801 | 5/1993 | Fournier et al. | 385/14 |
| 5,230,990 | 7/1993 | Iwasaki et al. | 430/321 |
| 5,253,319 | 10/1993 | Bhagavatula | 385/129 |
| 5,260,175 | 11/1993 | Kowanz et al. | 430/326 |

FOREIGN PATENT DOCUMENTS

| | | |
|---|---|---|
| 445527 | 9/1991 | European Pat. Off. |
| 3611246 | 10/1987 | Germany. |
| 3909449 | 11/1990 | Germany. |
| 60-232509 | 11/1985 | Japan. |
| 2173620 | 7/1990 | Japan. |

OTHER PUBLICATIONS

Spektrum der Wissenschaft, Dec. 1986, "Werkestoffe fur die Photonik", Von J. M. Rowell, pp. 116–128.
Elsevier Science Publishers B.V. (North-Holland), Nuclear Instruments and Methods in Physics Research A303 (1991), pp. 523–531, "Three-dimensional microfabrication using synchrotron radiation".
Physik-Verlag GmbH, Phys. B1. 46 (1990), "Licht steuert Licht-Photonik," Von F. Mitschke, pp. 463–469.
Physik-Verlag GmbH, Phys. B1. 40 (1984) Nr. 6, "Optische Bistabilitat: Ein Weg Zum optischen Computer?", Von A. Dorsel & P. Meystre, pp. 143–148.
Technishes Messen Sonderheft zur Sensor '91, 58 (1991) 4, pp. 152–157, supplied in the form of 27 pages of 8½×11" text, stapled.

Primary Examiner—Janet C. Baxter
Assistant Examiner—John A. McPherson
Attorney, Agent, or Firm—H. Gibner Lehmann; K. Gibner Lehmann

[57] ABSTRACT

A method to produce nonlinear optical microcomponents is described which makes it possible to employ material combinations not yet used to date. By means of X-ray depth lithography not only waveguide structures, but also microcell structures are produced, into which subsequently material of nonlinear optical properties is placed. By means of X-ray depth lithography and micromolding techniques a mold insert with a waveguide structure is produced as a positive mold, and the waveguide structure is impressed into a polymer base material by means of the mold insert. Then the impressed waveguide structure is filled with optically linear material, and after the filling operation at least one microcell structure is produced, at least in the areas of the optically linear material, into which microcell structure optically nonlinear material is placed. The microcell structure may also be impressed by means of another mold insert.

16 Claims, 4 Drawing Sheets

METHOD TO PRODUCE NONLINEAR OPTICAL MICROCOMPONENTS

CROSS REFERENCES TO RELATED APPLICATIONS

The present application claims priority under 35 USC 119, of German Application No. P 42 00 397.0-51, filed Jan. 10, 1992, entitled "Verfahren zur Herstellung yon nicht linearen optischen Mikrobauelementen" and having common ownership with the present application.

Reference is also made to applicants' German Application No. P 42 00 396.2-51, filed Jan. 10, 1992, entitled "Verfahren zur Herstellung von nicht linearen optischen Mikrobauelementen", and having common ownership with the present application.

Also, U.S. Ser. No. 08/002,822, filed Jan. 8, 1993 and which claims priority of German Application No. P 42 00396.2-51.

STATEMENT AS TO RIGHTS TO INVENTIONS MADE UNDER FEDERALLY-SPONSORED RESEARCH AND DEVELOPMENT.

Research and development of the present invention and application have not been Federally-sponsored, and no rights are given under any Federal program.

BACKGROUND OF THE INVENTION

1. Field of the Invention

The invention relates to a method for producing nonlinear optical microcomponents in which, by means of X-ray depth lithography and micromolding techniques, a mold insert with a waveguide structure is produced as positive mold, the waveguide structure is impressed into a polymer base material by means of the mold insert and the impressed waveguide structure is then filled with optically linear material.

2. Description of the Related Art Including Information Disclosed Under 37 CFR SS1.97-1.99

Optical microcomponents are used in optical miniature circuits in which light signals can be generated, guided in a plane through waveguides and processed as well as verified. The hitherto most important substrate materials to produce integrated optical components are glass, lithium niobate and silicon. The class of the 3-5 semiconductor materials has gained great importance for the monolithic integration of passive waveguide structures and optoelectronic components.

Known from "Technisches Messen, Special issue on Sensor 91" 58 (1991) 4, pages 152-157 is a method to produce optical microcomponents in which wafers are cut off a glass rod. The subsequent photolithographic process starts with making a suitably structured primary mask on an electron-beam recorder, which mask is copied by the direct contact method on the previously metal or photosensitive resist-coated glass wafer. After development of the resist and etching out the metal coating in the open resist areas, the desired waveguide structure is present as metal mask. To generate the waveguides, the glass wafers are put into a hot, molten salt bath wherein metal ions from the melt, driven by concentration gradients, penetrate the glass surface through the mask openings, increasing the refraction index there. After removal of the mask, individual chips are sawed out of the glass wafer and their faces polished for the later fiber coupling. The refraction index maximum of waveguides thus produced is directly at the glass surface.

Shielding the guided light waves succeeds by burying the extraneous ions below the substrate surface in a second exchange step which can be taken both diffusion-controlled (thermal) and drift-controlled (field supported).

To produce a non linear optical microcomponent on the basis of lithium niobate, a lithium niobate monocrystal is produced first—as described in "Spektrum der Wissenschaft" December 1986, page 116 ff—to whose surface is applied photolithographically a thin titanium film by means of a mask in order to impart to the monocrystal the desired waveguide structure. Then the entire arrangement is heated to about 1000° C. so that the titanium penetrates the outermost lithium niobate surface. The remaining titanium is etched away.

The disadvantage of these methods is that the choice of materials to produce nonlinear optical components is restricted. In particular, the combination of optically linear and optically nonlinear materials cannot be realized in the desired variety. In addition, these known methods are too costly for the mass production of nonlinear optical microcomponents.

In order to open up polymer materials for the application of waveguides in microcomponents, X-ray depth lithography was already employed in the past (see e.g. DE-PS 36 11 246). From an X-ray resist material it is possible, by means of X-ray depth lithography, to generate waveguide structures which are filled with a suitable polymer material to form waveguides. It is also possible, by means of X-ray depth lithography and electroforming, to produce mold inserts, by means of which waveguide structures can be impressed into polymer materials. These methods were hitherto used only to produce optically linear microcomponents.

SUMMARY OF THE INVENTION

It is an object of the invention to make available a method by which nonlinear optical microcomponents can be produced, at the same time making it possible to employ material combinations not yet used in the past, in particular the combination of polymers with linear optical properties and those with nonlinear optical properties. In addition, the method should be less costly than the methods according to the state of the art so as to make mass production possible.

This problem is solved by the methods according to patent claims 1 and 3. Advantageous embodiments are the subject of the sub-claims.

The invention is based on the discovery that it is possible to produce, by means of X-ray depth lithography, not only waveguide structures, but also microcell structures, into which material with nonlinear optical properties is placed.

According to a first embodiment, a mold insert with a waveguide structure is produced as positive mold by means of X-ray depth lithography and micromolding techniques. It is by means of this mold insert that the waveguide structure is impressed into a polymer base material and that, subsequently, the impressed waveguide structure is filled with optically linear material. Chosen as polymer base material is one which has a refraction index matching that of the optically linear material so that a planar light waveguide results. After filling the waveguide structure with optically linear material, at least one microcell structure is produced by X-ray depth lithography, at least in the optically linear area. Then, optically nonlinear material is placed in the microcell structure.

Preferably, when producing the microcell structure, the waveguide ends connecting to the microcell are structured at the same time. In particular, due to this structuring, the end surfaces on the light waveguides can be of curved design or be provided with diffractive structures, by means of which the light energy current density can be increased or decreased.

According to another embodiment, the microcell structure is not produced by means of X-ray depth lithography, but by means of another mold insert which was likewise produced by X-ray depth lithography and micromolding techniques. It is by means of this mold insert, which is of the microcell structure, that the latter is impressed at least in the areas of the optically linear area. After impressing, the microcell structure is filled with optically nonlinear material.

The nonlinear optical material is preferably a polymer also. Suitable materials are polyphenylvinylene (PPV), polyphenylacetylene (PPA), and/or polynapthylvinylene (PNV).

The optically nonlinear material may be a liquid polymer which remains in liquid state after it is placed in the microcell structure.

The liquid optically nonlinear material is locked in by a cover layer. Suited as cover layer is glass, for example.

After having been placed in the microcell structure, the optically nonlinear material may be stabilized by means of a low temperature plasma treatment or suitable radiation. In that case, a cover layer is unnecessary.

Instead of filling the microcell structure with a liquid polymer, it is also possible to insert into the microcell structure a solid having nonlinear properties. Crystals such as of barium titanate are suited for this purpose. In such cases, the nonlinear optical solid may also be applied to the substrate first, and the microcell structure produced by the method according to the invention may be applied to the substrate subsequently so as to enclose the nonlinear optical solid.

The entire microstructure is preferably provided with a cover layer consisting of glass or containing glass. Both the substrate and the cover layer or cover plate have preferably a refraction index smaller than that of the nonlinear optical material or the material forming the microcell structure.

To be able, if needed or desired, to influence the optical properties through an electrical field, electrodes are provided in the area of the nonlinear optical material. This can be accomplished in that, after the microcell structure is formed, a metal layer for the first electrode is applied in the area of the nonlinear optical material, and after the application of the non-linear material a second metal layer is applied for the second electrode. Another possibility is to provide the cover layer with an appropriate metallic coating before it is applied. If the nonlinear optical material consists of a solid, the latter may be provided with the appropriate, electrically conductive coatings before its insertion in the microcell structure.

Since, due to the use of X-ray depth lithography, there are no limits to the shapes waveguide structures and microcell structures can assume, a great variety of microcomponents such as coupling capacitors, gates or switches can be produced. Beyond this, different polymer materials can be combined with one another, making is possible, due to the better optical properties of these materials, to produce output-improved, active, optical microcomponents. The production times for the microcomponents are shorter than for those made by the methods according to the state of the art which is traceable, in particular, to the fact that the mold inserts to impress the structures can be used repeatedly without quality losses being detectable in the finished microcomponents.

BRIEF DESCRIPTION OF THE DRAWINGS

Embodiment examples of the invention are described in greater detail below, with reference to the drawings which illustrate the manufacture of a microswitch.

DESCRIPTION OF THE PREFERRED EMBODIMENT

Figure 1:
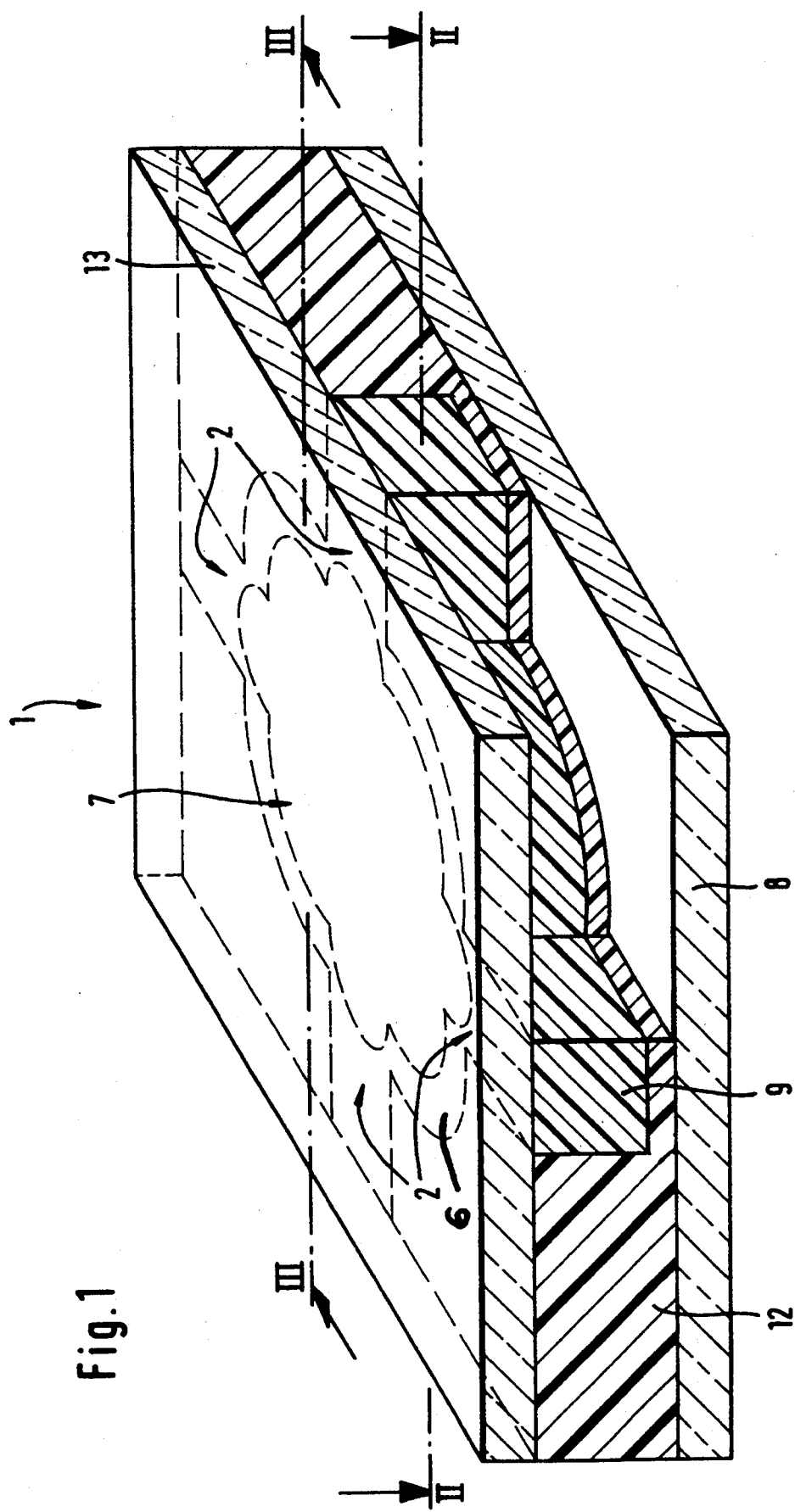
FIG. 1 shows the perspective view of a microcomponent in the form of a switch.
Figure 2:
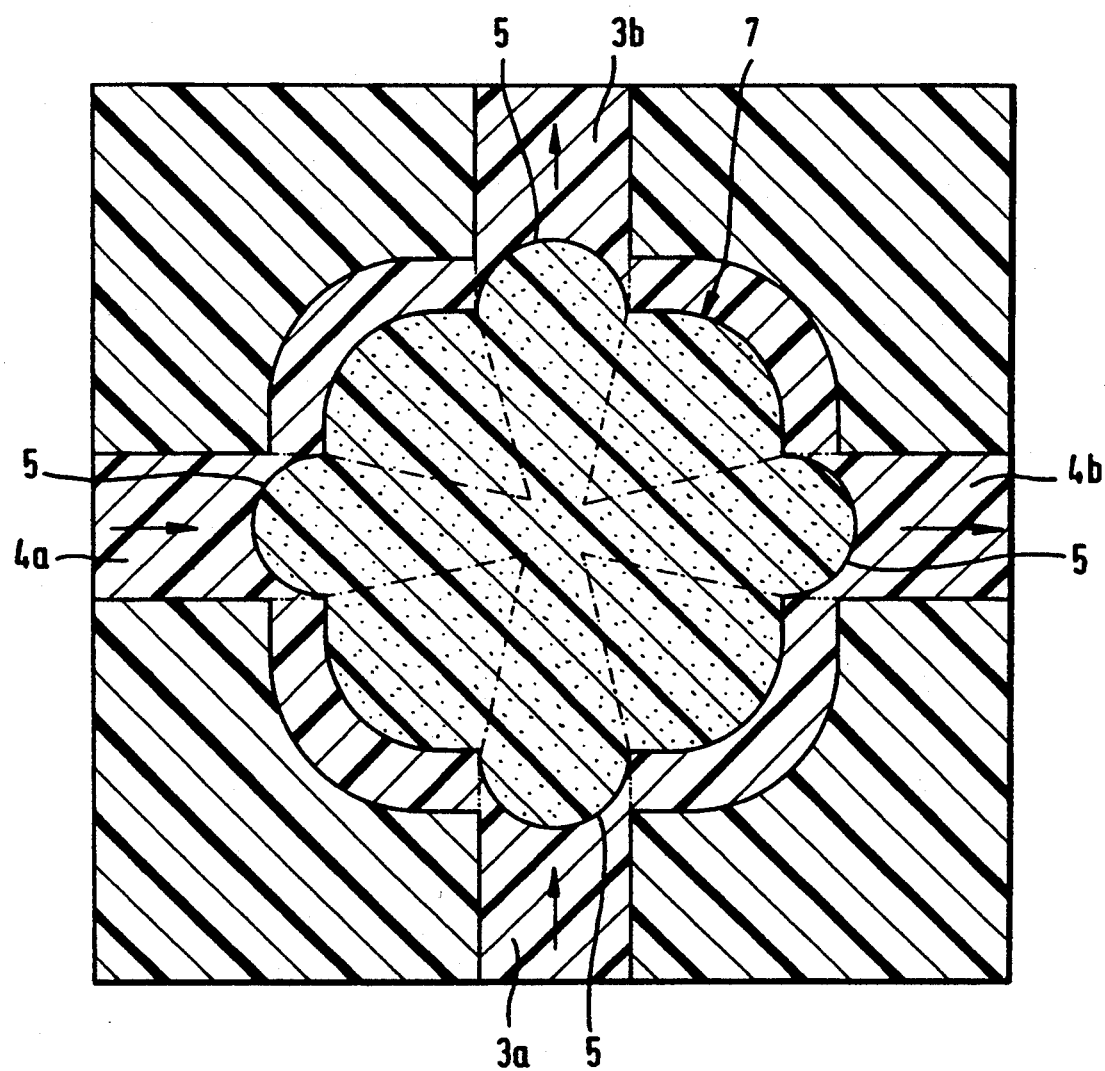
FIG. 2 is a section along the line II—II of the switch shown in FIG. 1.

Shown perspectively in FIG. 1 is an integrated, optical microswitch 1, the central area of the microcomponent 1 having been left out in the area of the front right corner to show the microstructure better. As may be seen particularly also in FIG. 2, the microswitch 1 has a waveguide structure 2 in the form of two intersecting waveguides 3a, b and 4a, b. In the area where the waveguides 3, 4 intersect there is a central area 6 which consists of the same material as the waveguides 3, 4 and in which a microcell structure 7 is formed which is filled with optically nonlinear material. The light waveguide ends 5 abutting the microcell structure are of curved design in order to focus the light——as may be seen in FIG. 2. The transparency of the optically nonlinear material within the microcell structure 7 can be controlled by the light intensity fed e.g. into the light waveguide 4a so that the light guided by the light waveguide 3a, b can be switched.

As may be seen in FIG. 1, a substrate 8 supports an optically linear material, such as PMMA, which forms the waveguide structure 2 and the central area 6. The filler material 12, enclosing the waveguides 3, 4, consists of fluoridated PMMA.

The entire waveguide structure 2 and the microcell structure 7 are covered by a cover layer 13 which, like the substrate 8, may consist of glass.

Producing such an optical microcomponent 1 is described in detail in the following, FIGS. 3a to 3i illustrating the manufacturing steps relative to a section along line III—III of FIG. 1.

Figure 3A:
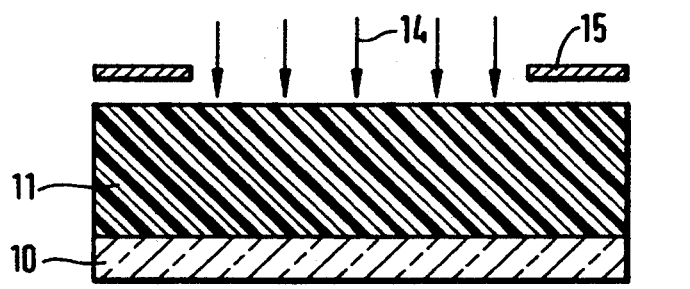
FIGS. 3a-3i show the manufacturing steps according to one embodiment of the method, relative to a section along line III—III of the switch shown in FIG. 1.
Figure 3B:
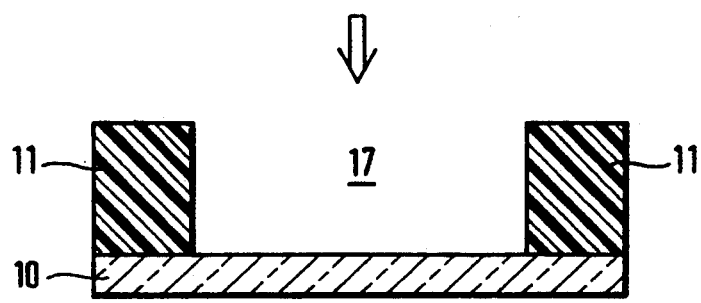
Figure 3C:
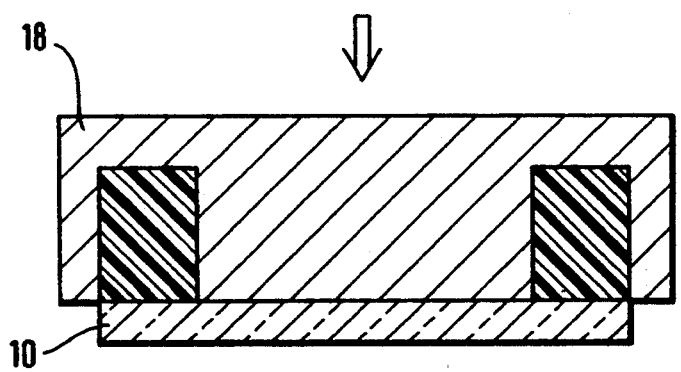
Figure 3D:
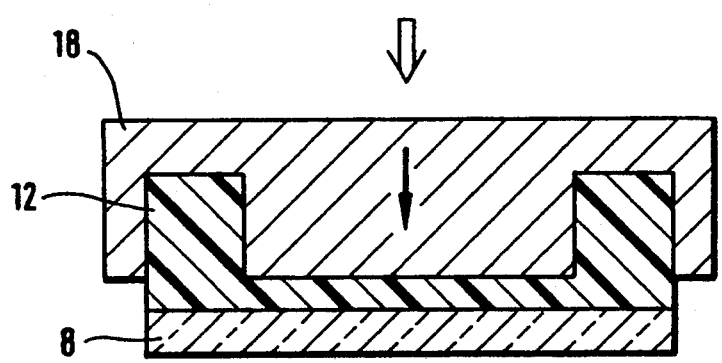
Figure 3E:
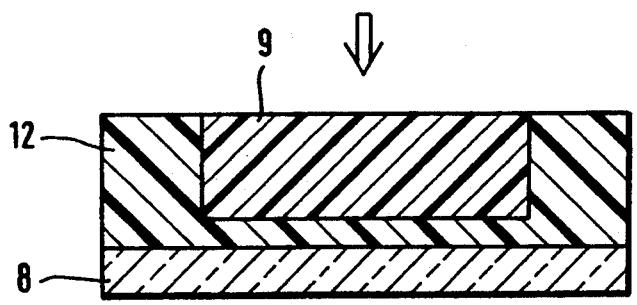

The first step of the process is shown in FIG. 3a. The resist material 11, located on a substrate 10, is radiated by X-rays 14 which penetrate a mask 15. The mask 15 contains the waveguide structure 2 and the microcell structure 7. After the radiation —as shown in FIG. 3b—the radiated areas are bared so that a free space 17 originates. The remaining parts of the resist material 11 are shaped by electroforming to create a mold insert 18 (see FIG. 3c). The mold insert 18 thus contains the waveguide structure and the microcell structure as a positive mold part.

In the next step of the process, the microstructure is impressed into a polymer material 12 located on a substrate 8. The free space thereby created after the removal of the mold insert 18 is filled with optically linear material 9.

There are two alternative process steps to shape the microcell structure.

Figure 3F:
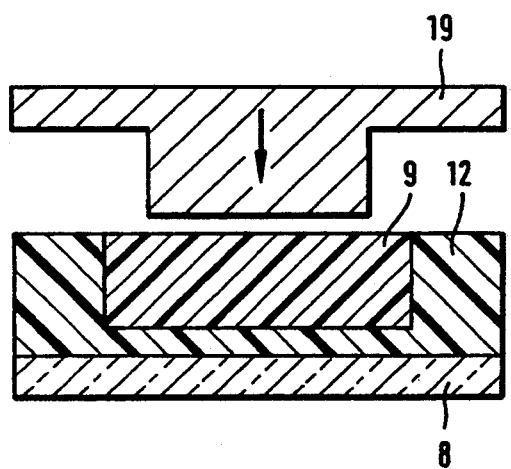

In FIG. 3f, the microcell structure 7 is impressed into the optically linear material 9 by means of an additional mold insert 19 (FIG. 3f). The mold insert 19 is preferably produced in the same way as the mold insert 18. The free space thereby created is subsequently filled out with optically nonlinear material 20. In the end, a cover layer 13 is yet applied.

Figure 3H:
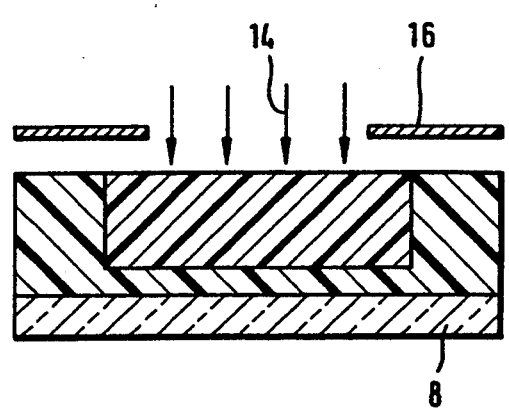
Figure 3G:
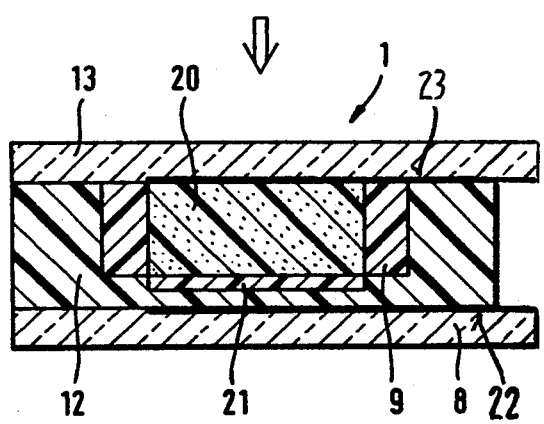

As may be seen in FIG. 3g there is under the nonlinear material 20 a thin film 21 of optically linear material which was displaced during the impressing operation.

Figure 3I:
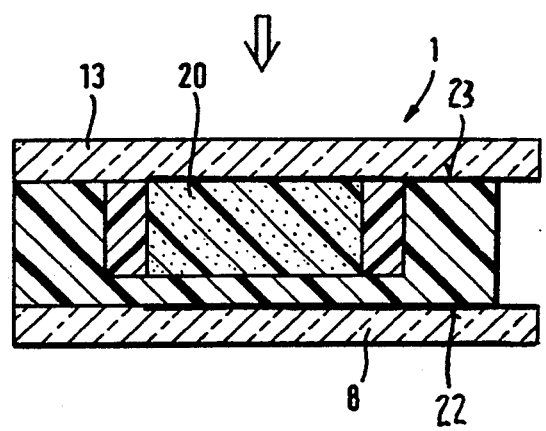

The other variant of the microcell structure production process is illustrated in FIG. 3h. By means of another mask 16, having the structure of the microcell structure, radiation by X-rays 14 is again performed. The radiated areas are subsequently bared and filled out with optically nonlinear material 20, as shown in FIG. 3i. The part 1 according to FIG. 3i differs from the part produced according to FIG. 3g in that the thin film 21 of optically linear material is not present under the nonlinear material 20.

To make this microstructure also into a light waveguide, the cover plate 13 has a smaller refraction index than the filler material 12. If there is no filler material 12 between the substrate 8 and the nonlinear optical material, the substrate 8 must also have a smaller refraction index than the filler material. This can be achieved in that the substrate 8 and the cover plate 13 each consist of two layers, the inner layer facing the microcomponent, for example consisting of precross-linked, fluoridated PMMA and the outer layer of glass or phenolic resin.

Preferably electrodes 22, 23 are provided on the substrate and cover plate, respectively. The bottom electrode 22 is evaporated or sputtered directly onto the upper side of the substrate 8 as a thin metal layer. If necessary, it can be structured by photolithographic means. The top electrode 23 is also evaporated or sputtered directly onto the lower side of the cover plate 13 and then structured by means of photolithography. Both electrodes top 23 and bottom 22, are accessible by means of extensions in both substrate and cover plate, as shown.

Variations and modifications are possible without departing from the spirit of the invention.

Each and every one of the appended claims defines an aspect of the invention which is separate and distinct from all others, and accordingly it is intended that each claim be treated in this manner when examined in the light of the prior art devices in any determination of novelty or validity.

List of reference symbols:
1. Microcomponent
2. Waveguide structure
3a, b Waveguide
4a, b Waveguide
5 Waveguide ends
6 Central area
7 Microcell structure
8 Substrate
9 Waveguiding layer
10 First substrate
11 Resist material
12 Filler material
13 Cover layer
14 X-ray radiation
15 First mask
16 Second mask
17 Free space
18 Mold insert
19 Mold insert
20 Optically nonlinear material
21 Layer of optically linear material
22 Electrode
23 Electrode

What is claimed is:

1. Method to produce nonlinear optical microcomponents out of a polymer base material, comprising the steps of:
   a) producing a mold insert having a waveguide structure and the form of a positive mold, by means of X-ray depth lithography and by means of micromolding,
   b) impressing the waveguide structure into said polymer base material by means of the mold insert,
   c) filling the impressed waveguide structure in the polymer base material with optically linear material,
   d) producing at least one microcell structure in the optically linear material, by means of X-ray depth lithography, and
   e) putting into the microcell structure, optically nonlinear material.

2. Method according to claim 1, characterized in that, simultaneous with producing the microcell structure, waveguide ends connecting with the microcell structure are produced.

3. Method to produce nonlinear optical microcomponents out of a polymer base material, comprising the steps of:
   a) producing a mold insert having a waveguide structure and in the form of a positive mold, by means of X-ray depth lithography and by means of micromolding,
   b) impressing the waveguide structure into said polymer base material by means of the mold insert,
   c) filling the impressed waveguide structure in the polymer base material with optically linear material,
   d) producing another mold insert by means of X-ray depth lithography, and impressing said other mold insert into the optically linear material to form a microcell structure, and
   e) filling optically nonlinear material into the microcell structure.

4. Method according to claim 3, characterized in that, simultaneous with producing the microcell structure, waveguide ends connecting with the microcell structure are produced.

5. Method according to claim 1, characterized in that polymers are used as the optically nonlinear material.

6. Method according to claim 1, characterized in that a cover layer is applied at least the area of the optically nonlinear material.

7. Method according to claim 1, characterized in that the optically nonlinear material remains liquid after having been put into the microcell structure and is locked in by a cover layer.

8. Method according to claim 7, characterized in that a cover layer of glass is used.

9. Method according to claim 1, characterized in that the optically nonlinear material, after having been put into the microcell structure, is stabilized by means of a low temperature treatment or by suitable radiation.

10. Method according to claim 1 characterized in that the optically nonlinear material is provided is with electrodes.

11. Method according to claim 3 characterized in that polymers are used as the optically nonlinear material.

12. Method according to claim 3, characterized in that a cover layer is applied at least in the area of the optically nonlinear material.

13. Method according to claim 3, characterized in that the optically nonlinear material remains liquid after having been put into the microcell structure and is locked in by a cover layer.

14. Method according to claim 13, characterized in that a cover layer of glass is used 15. Method according to claim 3, characterized in that the optically nonlinear material, after having been put into the microcell structure, is stabilized by means of a low temperature treatment or by suitable radiation.

16. Method according to claim 3, characterized in that the optically nonlinear material is provided with electrodes.

* * * * *